United States Patent
Kim et al.

(10) Patent No.: US 9,196,364 B2
(45) Date of Patent: Nov. 24, 2015

(54) NONVOLATILE MEMORY DEVICE HAVING SPLIT GROUND SELECTION LINE STRUCTURES

(71) Applicants: Minsu Kim, Hwaseong-Si (KR); Yang-Lo Ahn, Seoul (KR); Dae Han Kim, Seoul (KR); Kitae Park, Seongnam-Si (KR)

(72) Inventors: Minsu Kim, Hwaseong-Si (KR); Yang-Lo Ahn, Seoul (KR); Dae Han Kim, Seoul (KR); Kitae Park, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/244,930

(22) Filed: Apr. 4, 2014

(65) Prior Publication Data

US 2014/0347927 A1 Nov. 27, 2014

(30) Foreign Application Priority Data

May 27, 2013 (KR) ........................ 10-2013-0059855

(51) Int. Cl.
*G11C 16/04* (2006.01)
*G11C 16/08* (2006.01)
*G11C 16/34* (2006.01)

(52) U.S. Cl.
CPC ............ *G11C 16/08* (2013.01); *G11C 16/0483* (2013.01); *G11C 16/3427* (2013.01)

(58) Field of Classification Search
CPC ......... G11C 16/08; G11C 16/10; G11C 16/16
USPC .............. 365/185.11, 185.29, 185.23, 185.18
See application file for complete search history.

(56) References Cited

U.S. PATENT DOCUMENTS

| | | | |
|---|---|---|---|
| 6,028,788 A | 2/2000 | Choi et al. | |
| 6,252,817 B1* | 6/2001 | Seo et al. | 365/230.03 |
| 6,731,540 B2 | 5/2004 | Lee et al. | |
| 6,738,290 B2* | 5/2004 | Lee et al. | 365/185.17 |
| 7,151,686 B2 | 12/2006 | Sugimae et al. | |
| 7,646,664 B2 | 1/2010 | Cho et al. | |
| 7,821,832 B2 | 10/2010 | Hahn | |
| 7,894,265 B2 | 2/2011 | Lee et al. | |
| 7,940,578 B2 | 5/2011 | Kang et al. | |
| 8,279,674 B2 | 10/2012 | Fastow et al. | |
| 8,295,089 B2 | 10/2012 | Jeong et al. | |
| 8,792,282 B2* | 7/2014 | Lee et al. | 365/185.29 |
| 2009/0267128 A1 | 10/2009 | Maejima | |
| 2012/0140586 A1 | 6/2012 | Kim et al. | |
| 2012/0257452 A1 | 10/2012 | Kim et al. | |
| 2013/0170297 A1* | 7/2013 | Nam et al. | 365/185.09 |
| 2014/0104948 A1* | 4/2014 | Rhie | 365/185.11 |

FOREIGN PATENT DOCUMENTS

KR  1020100034878 A  4/2010

* cited by examiner

*Primary Examiner* — Connie Yoha
(74) *Attorney, Agent, or Firm* — Volentine & Whitt, PLLC

(57) ABSTRACT

A nonvolatile memory device includes a plurality of vertical NAND flash memory cells arranged in a three dimensional (3D) structure, a first memory block disposed in the 3D structure and having memory cells selected by a first ground selection line and a second ground selection line, wherein the first and second ground selection lines are electrically separated from each other, a second memory block disposed in the 3D structure and having memory cells selected by a third selection line and fourth selection line, wherein the third and fourth ground selection lines are electrically separated from each other, and a pass transistor that transfers a driving signal to turn on ground selection transistors respectively connected to the first and third ground selection lines in response to a block selection signal.

19 Claims, 14 Drawing Sheets

Fig. 3
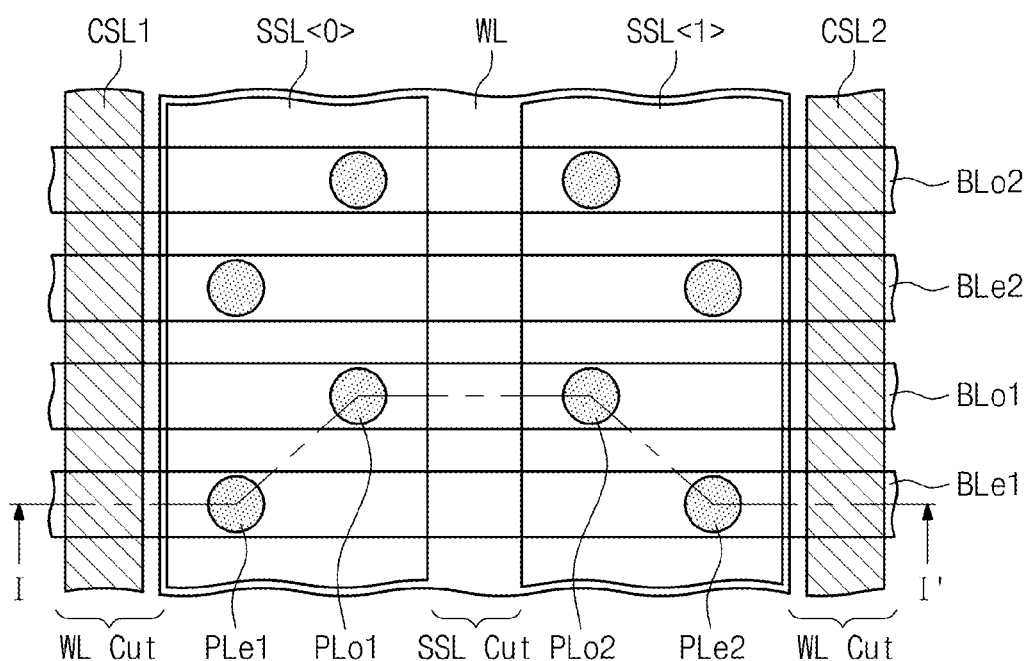
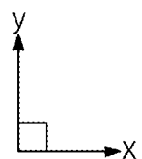

NONVOLATILE MEMORY DEVICE HAVING SPLIT GROUND SELECTION LINE STRUCTURES

CROSS-REFERENCE TO RELATED APPLICATIONS

This application claims priority under 35 U.S.C. §119 to Korean Patent Application No. 10-2013-0059855 filed on May 27, 2013, the subject matter of which is hereby incorporated by reference.

BACKGROUND OF THE INVENTION

The inventive concept relates generally to nonvolatile memory devices, and more particularly, three-dimensional (3D) nonvolatile memory devices having a split ground selection line structure.

Semiconductor memory devices can be roughly divided into two categories according to whether they retain stored data when disconnected from power. These categories include nonvolatile memory devices, which retain stored data when disconnected from power, and volatile memory devices, which lose stored data when disconnected from power.

Nonvolatile memory devices, such as flash memory, have gained increasing popularity in recent years due to the proliferation of devices requiring large amounts of nonvolatile data storage. Examples of such devices include computers, mobile phones, smart phones, personal digital assistants (PDAs), handheld PCs, gaming machines, fax machines, scanners, and printers, to name but a few.

In an effort to improve the integration density of nonvolatile memory devices such as flash memory devices, researchers have developed techniques for forming nonvolatile memory cells in 3D arrays. An example of a device comprising such a 3D array is a so-called vertical NAND flash memory, or 3D flash memory device. In a typical vertical NAND flash memory, word lines are stacked in a vertical direction to a substrate, and cell strings are configured by forming pillars which penetrate the stacked word lines.

To reduce loading of the word lines in a vertical NAND flash memory device, a ground selection line (GSL) split scheme is used. In a device using the split GSL scheme, GSL lines may be controlled for multiple units in a single memory block. Accordingly, through this structure, operation performance can be improved by reducing loading occurring according to relatively large word line capacity.

SUMMARY OF THE INVENTION

In one embodiment of the inventive concept, a nonvolatile memory device comprises a plurality of vertical NAND flash memory cells arranged in a 3D structure, a first memory block disposed in the 3D structure and having memory cells selected by a first ground selection line and a second ground selection line, wherein the first and second ground selection lines are electrically separated from each other, a second memory block disposed in the 3D structure and having memory cells selected by a third selection line and fourth selection line, wherein the third and fourth ground selection lines are electrically separated from each other, and a pass transistor that transfers a driving signal to turn on ground selection transistors respectively connected to the first and third ground selection lines in response to a block selection signal.

In another embodiment of the inventive concept, a nonvolatile memory device comprises a plurality of vertical NAND flash memory cells arranged in a 3D structure, multiple memory blocks disposed in the 3D structure and each comprising multiple individually electrically separated ground selection lines, and a row decoder concurrently transferring ground selection signals for turning on ground selection transistors connected to the ground selection lines of at least two memory blocks from among the memory blocks in response to block selection signals. The row decoder transfers the ground selection signals to the ground selection lines of the at least two memory blocks by one pass transistor.

In yet another embodiment of the inventive concept, a method is provided for operating a nonvolatile memory device comprising a plurality of vertical NAND flash memory cells arranged in a 3D structure, a first memory block disposed in the 3D structure and having memory cells selected by a first ground selection line and a second ground selection line, wherein the first and second ground selection lines are electrically separated from each other, and a second memory block disposed in the 3D structure and having memory cells selected by a third selection line and fourth selection line, wherein the third and fourth ground selection lines are electrically separated from each other. The method comprises transferring a driving signal to turn on ground selection transistors respectively connected to the first and third ground selection lines in response to a block selection signal.

These and other embodiments of the inventive concept can potentially reduce a chip area occupied by a row decoder in a vertical NAND flash memory device having a split GSL structure.

BRIEF DESCRIPTION OF THE DRAWINGS

The drawings illustrate selected embodiments of the inventive concept. In the drawings, like reference numbers indicate like features.

FIG. 3 illustrates a top surface of the memory block of FIG. 2, according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, certain embodiments of the inventive concept are described with reference to a flash memory device, which is an example of a nonvolatile memory device. Those skilled in the art will recognize that the inventive concept can be applied to other types of nonvolatile memory devices. Examples of such other devices include phase-change RAM (PRAM), magnetoresistive RAM (MRAM), resistive RAM (ReRAM), ferroelectric RAM (FRAM), and NOR flash memory, to name but a few.

Figure 1:
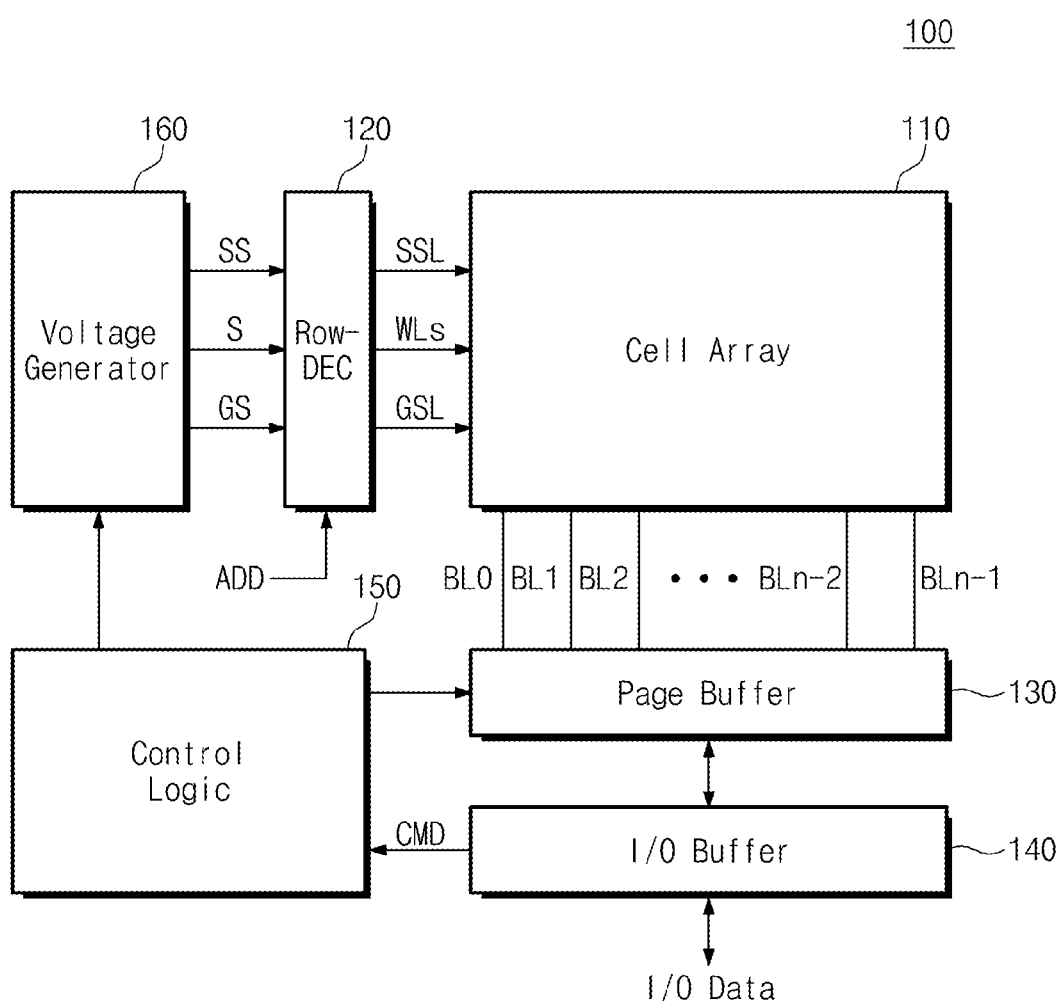
FIG. 1 is a block diagram illustrating a nonvolatile memory device, according to an embodiment of the inventive concept.

FIG. 1 is a block diagram of a nonvolatile memory device 100 according to an embodiment of the inventive concept.

Referring to FIG. 1, nonvolatile memory device 100 comprises a cell array 110, a row decoder (Row-DEC) 120, a page buffer 130, an input and output (I/O) buffer 140, control logic 150, and a voltage generator 160.

Cell array 110 is connected to row decoder 120 through word lines WL and selection lines SSL and GSL. Cell array 110 is connected to page buffer 130 through bit lines BL0 to BLn-1. Cell array 110 comprises multiple NAND cell strings, which form multiple memory blocks. The memory blocks constitute an operational unit or selection unit of nonvolatile memory device 100. For example, memory cells within the same memory block may be erased as a unit.

Cell array 110 is organized in a 3D structure in which each of the cell strings is arranged in vertical direction relative to a substrate, multiple word lines are stacked in a vertical direction, and channels of the cell strings are formed in the vertical direction. A nonvolatile memory device having cell array 110 with this 3D structure may be referred to as a vertical NAND flash memory device (VNAND).

Cell array 110 may be driven in a split GSL scheme. More specifically, one memory block may be controlled by at least two electrically split GSLs. A further description of how this may be accomplished is presented below.

Row decoder 120 receives an address ADD, and it selects one of memory blocks of cell array 110 and one of word lines WLs of the selected memory block in response to address ADD. Row decoder 120 transfers a word line voltage to the word lines of the selected memory block. In a program operation, row decoder 120 transfers a program voltage Vpgm and a verification voltage Vvfy to the selected word line, and it transfers a pass voltage Vpass to unselected word lines. In a read operation, row decoder 120 transfers a selection read voltage Vrd to the selected word line, and it transfers a non-selection read voltage Vread to unselected word lines. At the same time, the non-selection read voltage Vread may be transferred to selection lines GSL and SSL.

Row decoder 120 comprises multiple pass transistors supporting the split GSL scheme in order to reduce word line loading. The pass transistors transfer word line voltages or selection signals provided at high voltages to cell array 110 in response to a block selection signal. The pass transistors are typically formed of high voltage transistors. Row decoder 120 provides multiple ground selection signals GS<0>, GS<1>, . . . , GS<j-1> having different voltage levels to one memory block. For this function, one pass transistor may be configured to simultaneously transfer ground selection signals GS<0>, GS<1>, . . . , GS<j-1> to the memory blocks.

Page buffer 130 operates as a write driver or a sense amplifier according to an operation mode. In a program operation, page buffer 130 transfers bit line voltages corresponding to data to be programmed to the bit lines of cell array 110. In a read operation, page buffer 130 senses data stored in the selected memory cell through bit lines. Page buffer 130 latches and transfers the sensed data to the outside. In a delete operation, page buffer 130 floats the bit lines.

I/O buffer 140 transfers write data received in the program operation to page buffer 130. I/O buffer 140 outputs read data provided from page buffer 130 in the read operation to the outside. I/O buffer 140 transfers input addresses or commands to control logic 150 or row decoder 120.

Control logic 150 controls page buffer 130 and row decoder 120 in response to commands (CMDs) transferred from the outside. Control logic 150 controls page buffer 130 and voltage generator 160 etc., to access the selected memory cells in response to the CMDs provided from the outside.

Voltage generator 160 generates various types of word line voltages to be provided to each word line, and voltages to be provided to bulks (e.g., well regions) in which the memory cells are formed, according to controls of control logic 150. The word line voltages to be provided to each word line include a program voltage Vpgm, a pass voltage Vpass, selection and non-selection read voltages Vrd and Vread. Voltage generator 160 generates selection signals SS and GS to be provided to selection lines SSL and GSL in the read operation and program operation. Selection signal SS is a control signal for selecting a string. Selection signal GS is a ground selection signal.

Voltage generator 160 generates voltages for selecting memory cells in the read or write operation. For example, voltage generator 160 may generate a word line voltage S and selection line voltages SS and GS. Word line voltage S and selection line voltages SS and GS generated by voltage generator 160 are transferred to cell array 110 through row decoder 120.

Figure 2:
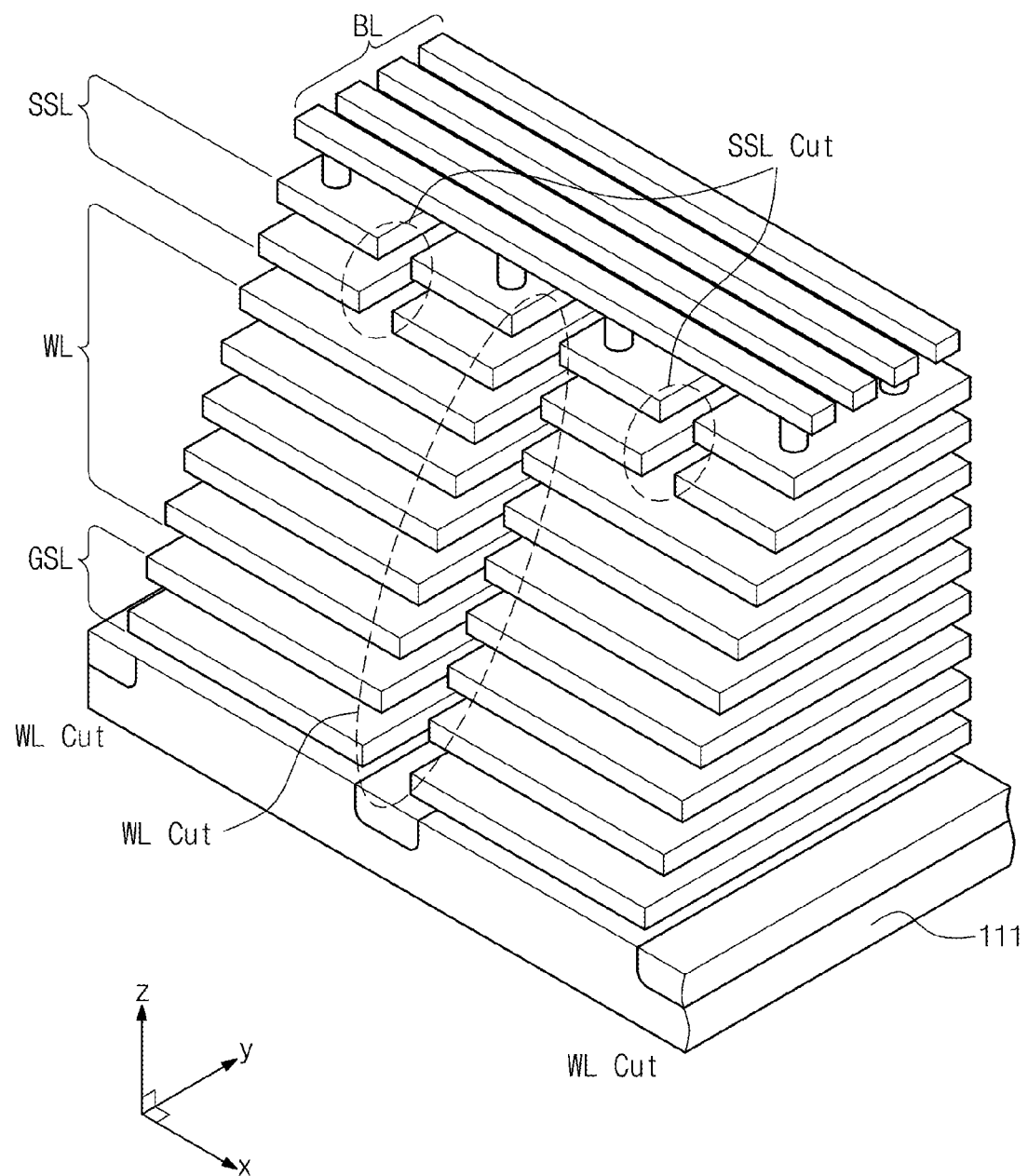
FIG. 2 is a perspective view of a memory block according to an embodiment of the inventive concept.

FIG. 2 is a perspective view illustrating a memory block of cell array 110 according to an embodiment of the inventive concept.

Referring to FIG. 2, ground selection lines GSL, multiple word lines WL, and string selection lines SSL are stacked on a substrate 111. The stacked conductive layers are separated by word line cut WL Cut, and at least one string selection line SSL is separated by a string selection line cut SSL Cut.

Multiple pillars penetrate at least one ground selection line GSL, word lines WL, and at least one string selection line SSL in a z-direction. The at least one ground selection line GSL, word lines WL, and the at least one string selection line SSL comprise conductive layers. Also, multiple bit lines BL are formed on top surfaces of the pillars. The pillars are respectively connected to each corresponding bit line.

Although FIG. 2 shows that string selection line SSL and ground selection line GSL are respectively formed of two conductive layers, the inventive concept is not limited hereto. For example, string selection line SSL and ground selection line GSL may alternatively be formed of one conductive layer or 3 or more of conductive layers.

FIG. 3 illustrates a top surface of a memory block shown in FIG. 2.

Referring to FIG. 3, common source lines CSL1 and CSL2 are on a bottom surface of word line cuts WL Cut, and string selection cut SSL Cut is interposed between word line cuts WL Cut. On a bottom portion of word line cuts WL Cut, common source lines CSL1 and CSL2 are formed, and the pillars for forming the cell strings to be connected to common source lines CSL1 are formed.

First, pillars PLe1 and PLo1 connected to string selection line SSL<0> and bit lines BLe1 and BLo1 are described. The cell strings formed by pillar PLe1, the ground selection lines (not shown), word lines WL, and string selection line SSL<0> in a vertical (z-direction) direction are formed with a constant interval in an x-direction from common source line CSL1. Also, the cell strings formed by pillar PLo1, the ground selection lines (not shown), word lines WL, and string selection line SSL<0> in the vertical direction are formed with a predetermined interval in an x-direction from common source line CSL1. This pillar formation scheme may be also applied to pillars connected to the string selection lines SS1 and the bit lines BLe2 and BLo2.

Then, pillars PLe2 and PLo2 connected to string selection lines SSL<1> and bit lines BLe2 and BLo2 are described. The cell strings formed by pillar PLe2, the ground selection lines (not shown), word lines WL, and string selection line SSL<1> in a vertical (z-direction) direction are formed with a constant interval in an x-direction from common source line CSL2. Also, the cell strings formed by pillar PLo2, the ground selection lines (not shown), word lines WL, and string selection line SSL<1> in the vertical direction are formed with a predetermined interval in an x-direction from common source line CSL2. That is, pillars PLe2 and PLo2 connected to the string selection lines SSL<1> and bit lines BLe1 and BLo1 are symmetric about a y-axis with pillars PLe1 and PLo1 connected to string selection line SSL<0> and bit lines BLe1 and BLo1.

Figure 4:
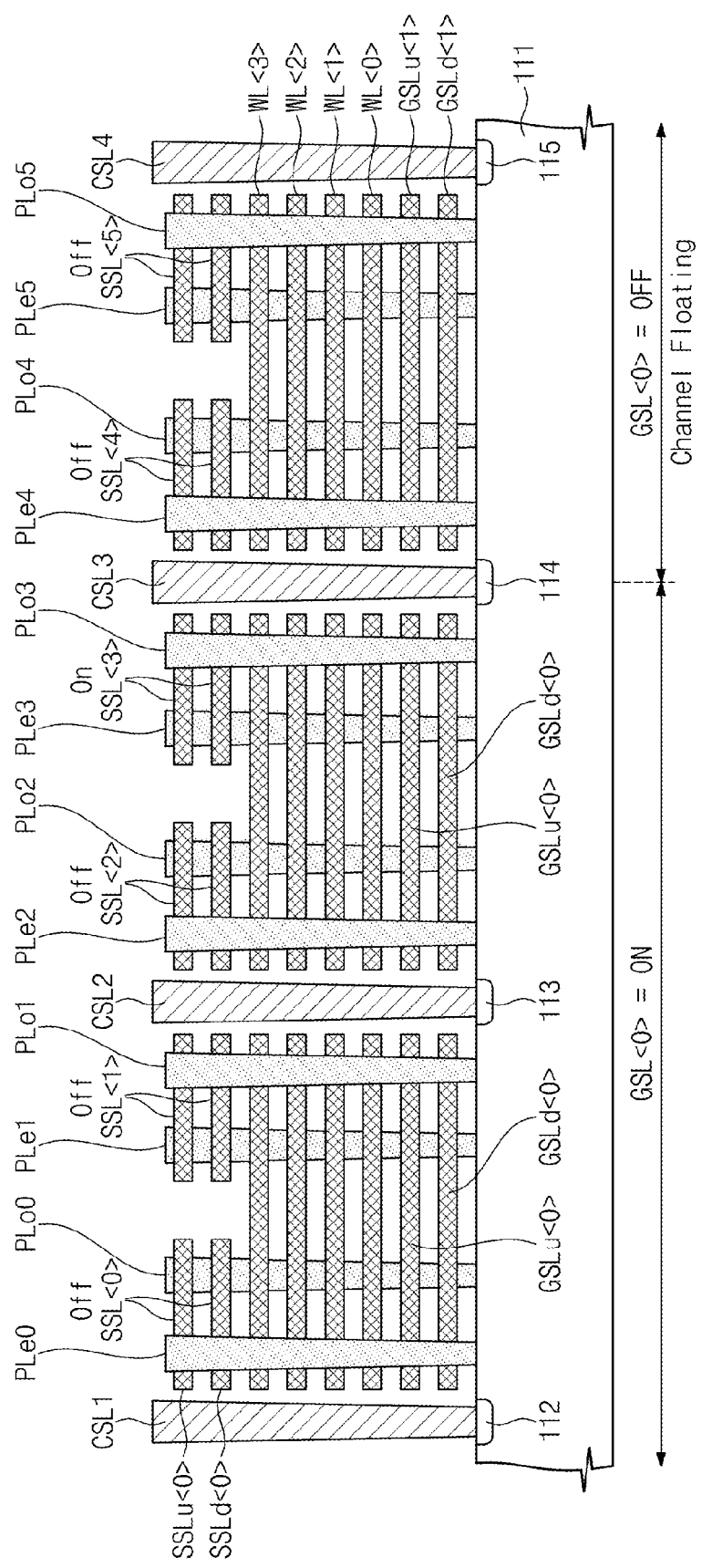
FIG. 4 illustrates a cross-sectional view of a cell array having a type of split GSL, according to an embodiment of the inventive concept.

FIG. 4 is a cross-sectional view of a cell array having a split GSL, according to an embodiment of the inventive concept.

Referring to FIG. 4, a cut surface I-I' shown in FIG. 3 is extended in multiple units. Selection lines GSL and SSL or multiple word lines WL<0> to WL<3> are stacked on a top surface of substrate 111. Multiple pillars PLe0, PLo0, PLe1, PLo1, PLe2, PLo2, PLe3, PLo3, PLe4, PLo4, PLe5, and PLo5 penetrating the stacked selection lines GSL and SSL or word lines WL<0> to WL<3> are provided.

Substrate 111 may be a well having a first conductive type. For example, substrate 111 may be a P-well formed by injection of a group 3 element such as boron (B). For example, substrate 111 may be a pocket P-well provided in an N-well.

Multiple elongated doped regions 112 to 115 are provided along a y-direction on substrate 111. Doped regions 112 and 113 are formed separately in a predetermined distance from each other along an x-direction on substrate 111. Doped regions 112 to 115 have a second conductive type which is different from that of substrate 111. For example, doped regions 112 to 115 may have an N conductive type. In the following description, it is assumed that doped regions 112 to 115 have the N conductive type. However, doped regions 112 to 115 are not limited to the N conductive type.

Among doped regions 112 to 115, multiple insulating materials are formed between the word lines and the selection lines. The insulating materials are sequentially provided along a z-direction on substrate 111. The insulating materials may include insulating materials such as silicon oxide.

Among doped regions 112 to 115, pillars PLe0, PLo0, PLe1, PLo1, PLe2, PLo2, PLe3, PLo3, PLe4, PLo4, PLe5, and PLo5 are sequentially disposed along the x-direction and penetrate the insulating materials, selection lines, and word lines along the z-direction. Pillars PLe0, PLo0 PLe1, PLo1, PLe2, PLo2, PLe3, PLo3, PLe4, PLo4, PLe5, and PLo5 penetrate the insulating materials to contact substrate 111. Pillars PLe0, PLe1, PLe2, PLe3, PLe4, and PLe5 are connected to any one of even numbered bit lines, and pillars PLo0, PLo1, PLo2, PLo3, PLo4, and PLo5 are connected to any one of odd numbered bit lines.

In some embodiments, pillars PLeN and PLoN (N is a positive integer) are respectively formed of multiple layers. Pillars PLeN and PLoN may comprise channel layers and internal materials. The internal materials and the channel layers enclosing the internal materials may be provided to each of pillars PLeN and PLoN. For example, the channel layer may include a semiconductor material (e.g., silicon) having the same conductive type as substrate 111. In the description that follows, it is assumed that the channel layer comprises P-type silicon. However, the channel layer is not limited to the P-type silicon. For example, the channel layers may include an intrinsic semiconductor without any conductive type. The internal materials comprise an insulating material. For example, the internal materials may include an insulating material such as silicon oxide. For example, the internal materials may include an air gap.

Data storing layers are provided on exposed surfaces of the insulating materials and pillars PLeN and PLoN. In certain embodiments, pillars PLeN and PLoN, may be disposed in a staggered structure. This staggered structure has an effect of reducing a memory cell area. Each pillar PLeN and PLoN, forms a single vertical string together with neighboring data storing layers and neighboring conductive materials. That is, pillars PLeN and PLoN, form multiple vertical strings together with the data storing layers and the conductive materials. Each of the vertical strings comprises multiple cell transistors stacked in a vertical direction to substrate 111.

String selection line SSL comprises upper string selection lines SSLu<m> (m is an integer greater than or equal to 0) and lower string selection lines SSLd<m>. Upper string selection lines SSLu<0> and SSLu<1> and lower string selection lines SSLd<0> and SSLd<1> are separated by string selection line cut SSL Cut. However, string selection line SSL is not limited thereto. In general, string selection lines SSL may be implemented by at least one conductive layer.

Ground selection line GSL comprises upper ground selection lines GSLu<n> and lower ground selection lines GSLd<n>. However, ground selection lines GSL are not limited thereto. In general, ground selection lines GSL may be formed of one conductive layer regardless of the upper portion or the lower portion.

Ground selection lines GSL<n> may be provided as one block and two selection lines which are electrically separated. That is, ground selection lines GSL<n> may be formed and driven in a ground selection line split scheme in order to reduce loading of the word lines in one memory block. As shown in the FIG. 4, the ground selection line in one memory block may be formed of and driven by two split ground selection lines GSL<0> and GSL<1>.

For a split GSL, ground selection transistors (GSTs) of the cell strings corresponding to pillars PLe0, PLo0, PLe1, PLo1, PLe2, PLo2, PLe3, PLo3 are driven by ground selection lines GSL<0>. In addition, GSTs of the cell strings corresponding to the pillars PLe4, PLo4, PLe5, and PLo5 are driven by ground selection lines GSL<1>. Although it is illustrated that GSTs of the cell strings in one memory block are driven by the different ground selection lines GSL<0> and GSL<1>, it is well understood that cell strings in one memory block may be driven by at least three or more electrically split ground selection lines.

In a read operation, split ground selection lines GSL<1> may be driven to block GSTs of non-selected strings. The non-selected cell strings from among the cell strings corresponding to the split ground selection lines GSL<0> may drive the string selection lines SSL<0> to SSL<2> in order to block the string selection transistors SSTs individually included therein.

Figure 5:
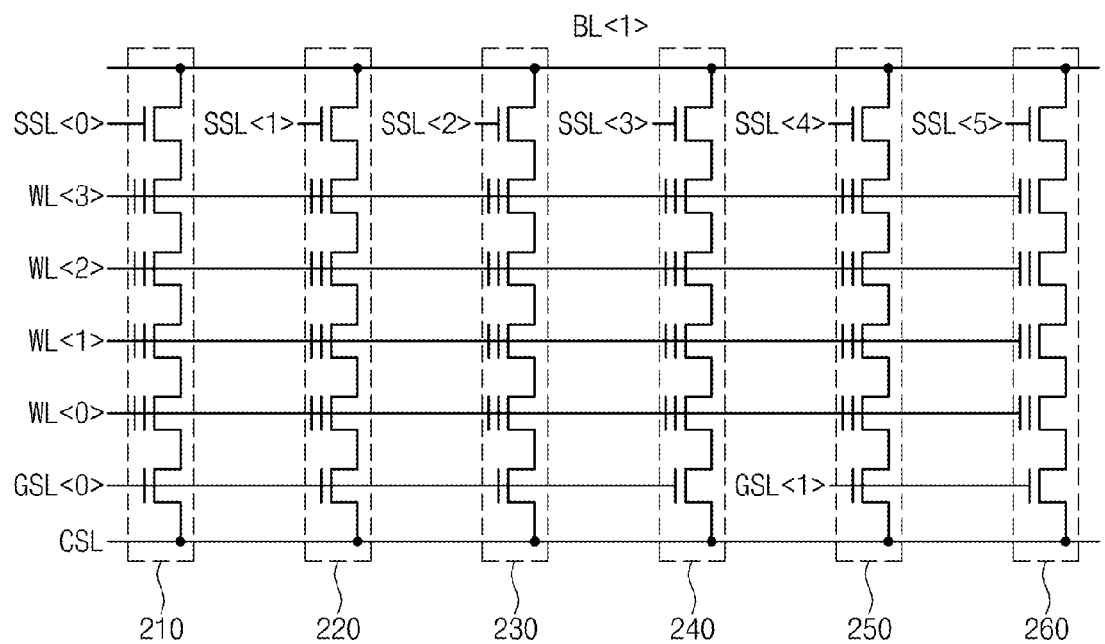
FIG. 5 is a circuit diagram illustrating cell strings connected to one bit line in the cell array of FIG. 4, according to an embodiment of the inventive concept.

FIG. 5 is a circuit diagram illustrating cell strings connected to one bit line in the cell array of FIG. 4, according to an embodiment of the inventive concept.

Referring to FIG. 5, the cell strings are shown which correspond to pillars PLe0 to PLe5 connected to bit line BL<1>. Cell strings 210, 220, 230, 240, 250, and 260 connected to bit line BL<1> are divided into two units by the connected ground selection lines GSL<0> and GSL<1>. That is, the two units are cell strings 210 to 240 connected to split ground selection line GSL<0> and cell strings 250 and 260 connected to the split ground selection line GSL<1>. However, the respective string selection transistors for cell strings 210, 220, 230, 240, 250, and 260 are connected to different string selection lines SSL<0> to SSL<5>.

When driving the memory block in the ground selection line split scheme, ground selection lines GSL<0> and GSL<1> may be individually controlled. It is assumed that a turn-on voltage (e.g., about 5V) is provided to ground selection lines GSL<0>, and a turn-off voltage (e.g., about 0V) is provided to ground selection lines GSL<1>. In this case, channels of the cell strings connected to ground selection lines GSL<1> are electrically separated from common source line CSL. That is, the channels of the cell strings connected to ground selection lines GSL<1> float. Accordingly, although the word line voltage is provided, loading by cell strings 250 and 260 may be reduced.

In addition, the ground selection transistors of cell strings 210, 220, 230 and 240 connected to ground selection lines GSL<0> having the turn-on voltage Vread provided are turned on. However, in this case, the turn-off voltage is provided to the string selection lines SSL<0>, SSL<1>, and SSL<2> except the selected cell string 240. In this case, the channels of cell strings 210, 220, and 230 are blocked from the bit line BL<1>.

Figure 6:
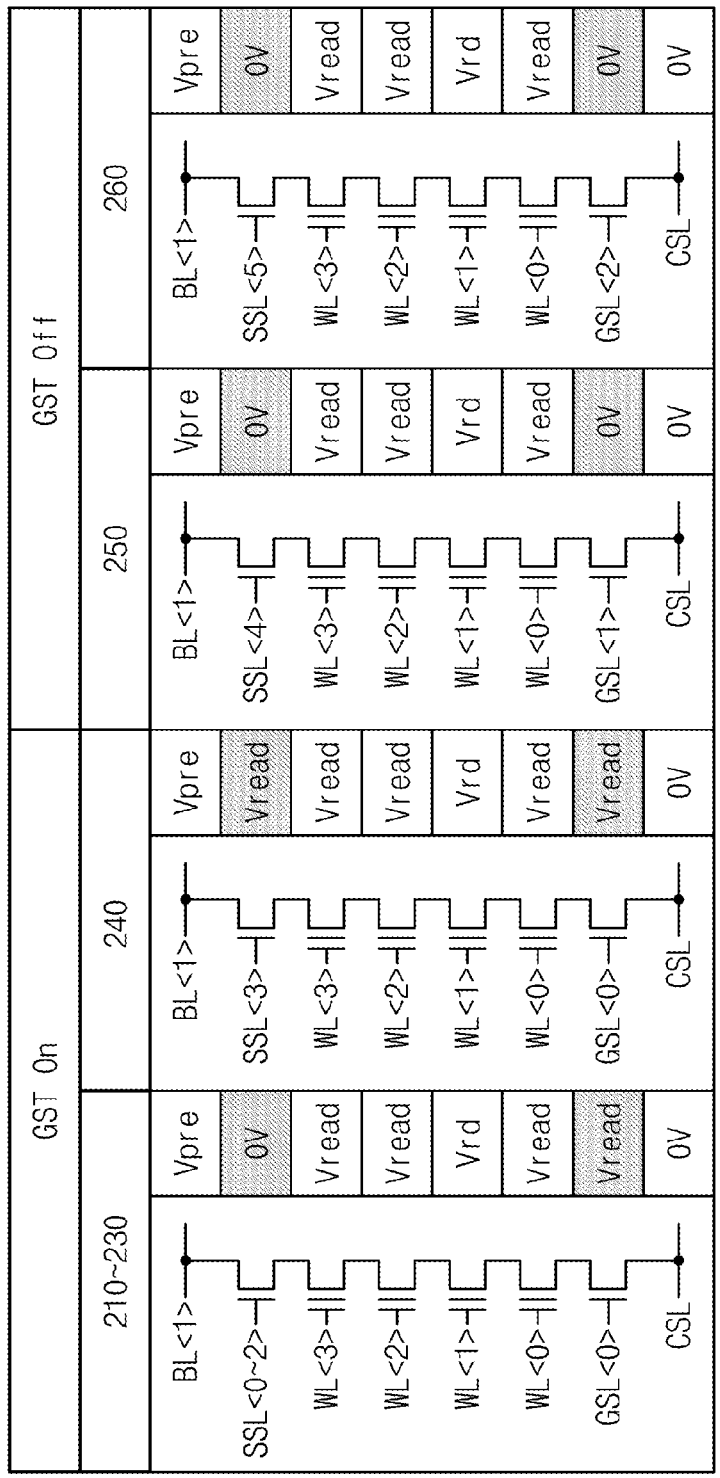
FIG. 6 is a table illustrating a read bias applied to the cell strings of FIG. 5, according to an embodiment of the inventive concept.

FIG. 6 is a table illustrating a read bias applied to the cell strings of FIG. 5, according to an embodiment of the inventive concept.

Referring to FIG. 6, the channels of the cell strings connected to the non-selection ground selection line by the ground selection line split are blocked from common source line CSL.

First, in a read operation, bit line BL<1> of the memory block is charged with a pre-charge voltage Vpre by page buffer 130 of FIG. 1. Also, a selection read voltage Vrd is provided to selection word line WL<1> of the respective cell strings 210 to 260. The selection read voltage Vrd is a word line voltage for identifying data stored in the selected memory cells. The non-selection read voltage Vread (about 5V) is provided to non-selection word lines WL<0> and WL<2> of the respective cell strings 210 to 260. Non-selection read voltage Vread is a word line voltage for forming channels by turning on all the memory cells connected to the non-selection word lines. In addition, a ground voltage (about 0V) or higher may be provided to common source line CSL.

In this state, a non-selection read voltage Vread is provided to split ground selection line GSL<0>. GSTs of cell strings 210 to 240 may be turned on by the non-selection read voltage Vread. Where the word line voltage is provided, the channels formed on cell strings 210 to 240 may be connected to common source line CSL. In contrast, about 0V may be provided to the split ground selection line GSL<1>. In this case, GSTs of cell strings 250 and 260 may be blocked. Accordingly, the channels of cell strings 250 and 260 are separated from common source line CSL regardless of the word line voltage. Namely, the channels of cell strings 250 and 260 float.

In addition, about 0V may be provided to the string selection lines SSL<0> to SSL<2>, SSL<4>, and SSL<5> so that the string selection transistors (SSTs) of cell strings 210 to 230, 250, and 260 are blocked. According to this read bias, the channels of cell strings 250 and 260 connected to the split ground selection line GSL<1> may maintain the floating state, although the word line voltage is provided. Therefore, loading of the word line voltage is reduced where the loading is caused by capacitive coupling according to a channel potential of cell strings 250 and 260.

In this context, loading means an effect on driving of the word line voltage according to capacitive coupling between the word lines and channels. Namely, the capacitive coupling between the word lines and the cell strings affects a rising speed of the word line voltage. In particular, capacitive coupling between the channel connected to common source line CSL of a ground level and the word line operates large loading on the rising of the word line voltage. However, in a state where a channel of a cell string floats, a channel potential may rise with the word line voltage. Accordingly, word line loading due to the capacitive coupling may be reduced.

Figure 7:
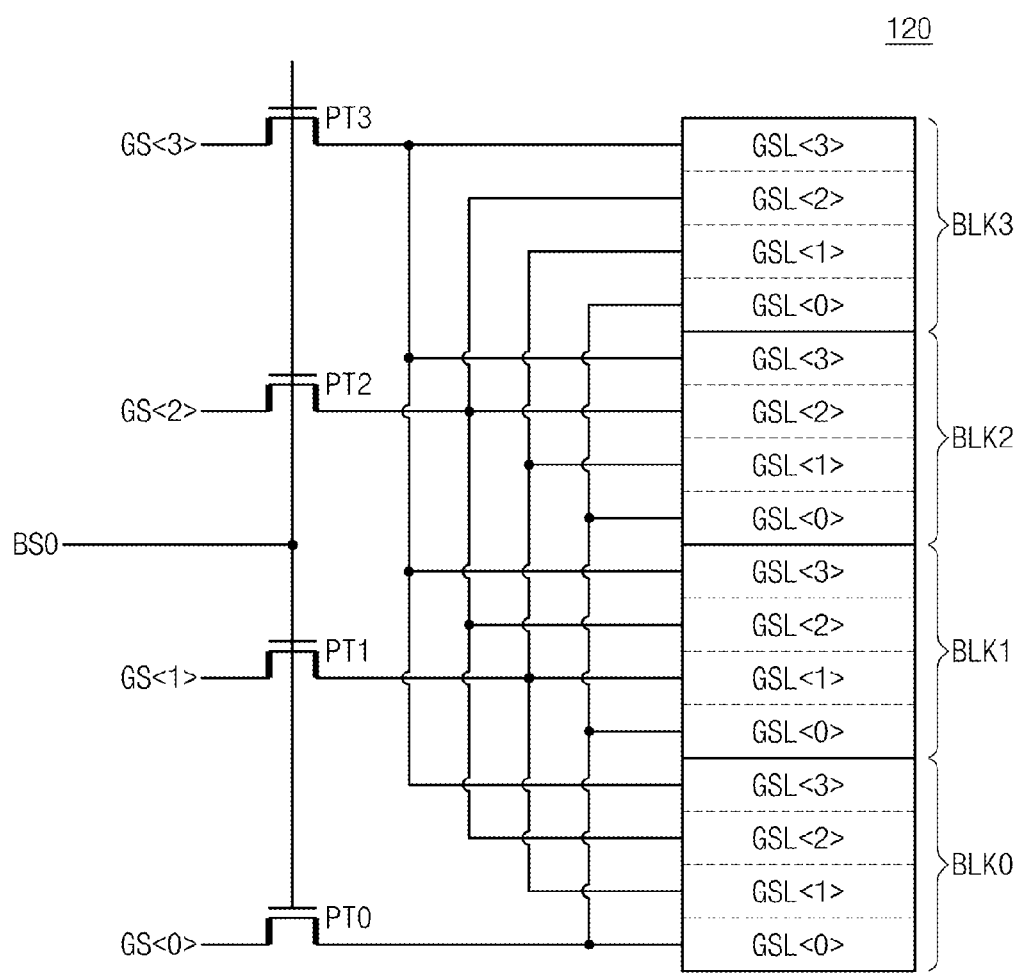
FIG. 7 illustrates a row decoder for driving a split GSL as shown in the table of FIG. 6, according to an embodiment of the inventive concept.

FIG. 7 illustrates a row decoder for driving a split GSL as shown in the table of FIG. 6, according to an embodiment of the inventive concept.

Referring to FIG. 7, multiple ground selection lines GSL are driven by one pass transistor. Ground selection signals GS<0> to GS<3> generated from voltage generator 160 of FIG. 1 are switched by pass transistors PT0 to PT3, which are formed of high voltage transistors. Pass transistors PT0 to PT3 are switched by a block selection signal BS0.

Pass transistor PT0 drives respective ground selection lines GSL<0> of multiple split memory blocks. For example, pass transistor PT0 transfers a ground selection signal GS<0> to each of ground selection lines GSL<0> of memory blocks BLK0, BLK1, BLK2, and BLK3. Memory blocks BLK0, BLK1, BLK2, and BLK3 may be or may not be neighbored. In this scheme, pass transistor PT1 transfers a ground selection signal GS<1> to each of ground selection lines GSL<1> of memory blocks BLK0, BLK1, BLK2, and BLK3. Pass transistor PT2 transfers ground selection signal GS<2> to each of ground selection lines GSL<2> of memory blocks BLK0, BLK1, BLK2, and BLK3. Pass transistors PT3 transfer ground selection signal GS<3> to each of ground selection lines GSL<3> of memory blocks BLK0, BLK1, BLK2, and BLK3.

Each of pass transistors PT0, PT1, PT2, and PT3 drives ground selection lines of at least two different memory blocks. According to this structure, the split ground selection lines may be easily driven without further pass transistors.

Figure 8:
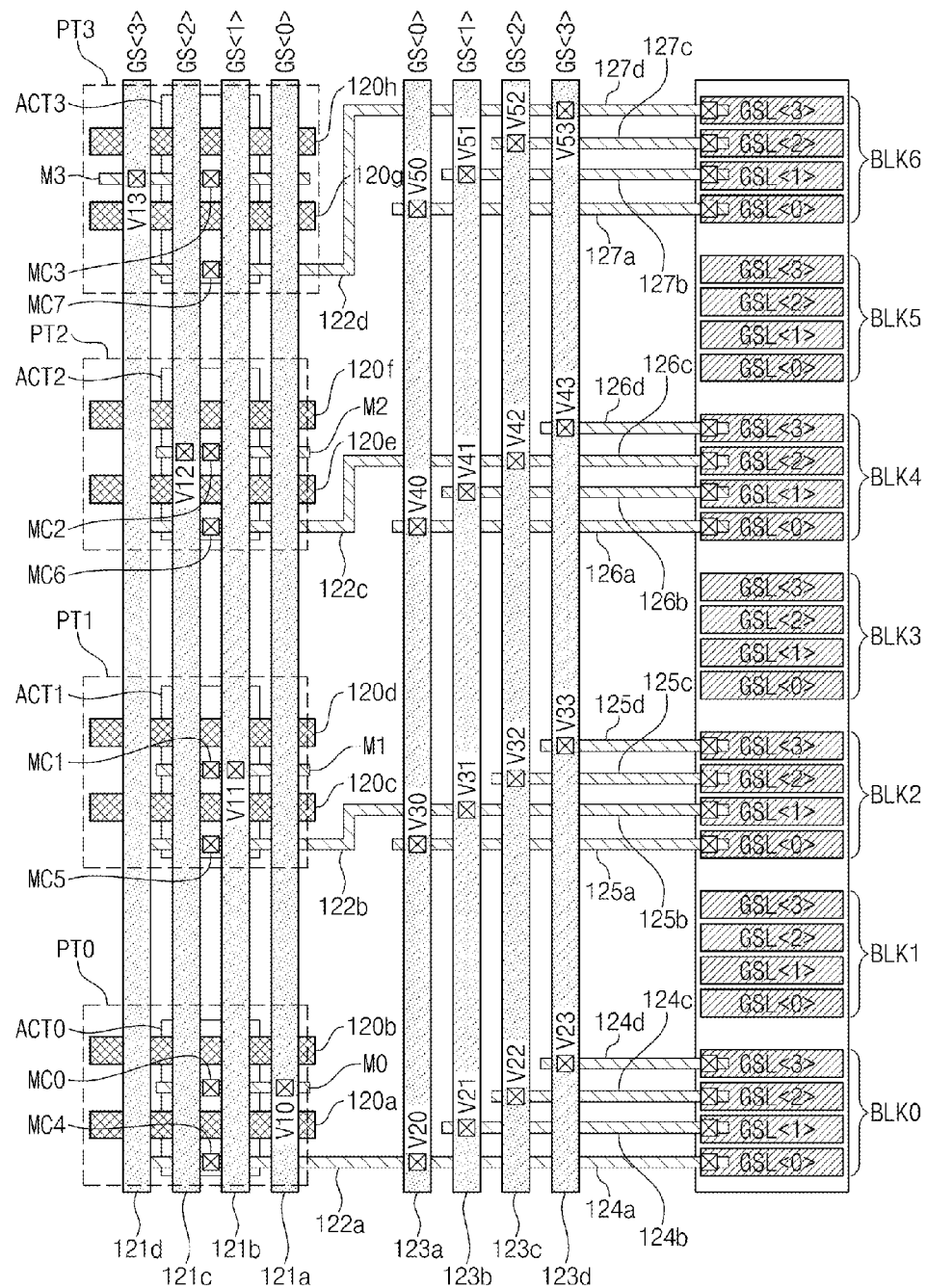
FIG. 8 illustrates a layout structure of pass transistors and interconnections for driving split GSLs, according to an embodiment of the inventive concept.

FIG. 8 illustrates a layout structure of the pass transistors and interconnections to drive the ground selection lines, according to an embodiment of the inventive concept.

Referring to FIG. 8, a layout structure is shown where one pass transistor drives ground selection lines of multiple memory blocks Pass transistor PT0 comprises an active region ACT0 and gate lines 120a and 120b disposed thereon, and multiple driving signal lines 121a, 121b, 121c, and 121d having driving signals GS<0>, GS<1>, GS<2>, and GS<3> provided. Pass transistor PT0 may be formed to have two sources and one common drain in active region ACT0 due to two gate lines 120a and 120b. The common drain of pass transistor PT0 is connected through a driving signal line 121*a*, a via V10, a metal line M0, and a metal contact MC0. Source S of pass transistor PT0 is connected to a common driving line 123*a* through a metal contact MC4, a metal line 122*a*, and a via V20. Accordingly, common driving line 123*a* distributes driving signal GS<0> to ground selection lines GSL<0> of each of memory blocks BLK0, BLK2, BLK4, and BLK6.

Driving signal GS<0> provided to common driving line 123*a* is transferred to ground selection line GSL<0> of memory block BLK0 through a metal line 124*a*. Driving signal GS<0> provided to common driving line 123*a* is transferred to a metal line 125*a* connected through a via V30. Driving signal GS<0> provided to common driving line 123*a* is transferred to a metal line 126*a* through a via V40. Also, driving signal GS<0> is transferred to ground selection signal GSL<0> of memory block BLK4 through a metal line 126*a*. Driving signal GS<0> provided to common driving line 123*a* is transferred to a metal line 127*a* connected through a via V50. Also, driving signal GS<0> is transferred to ground selection line GSL<0> of memory block BLK6 through metal line 127*a*. Each of metal lines 124*a*, 125*a*, 126*a*, and 127*a* are electrically connected through each of ground selection lines GSL<0> and metal contacts of memory blocks BLK0, BLK2, BLK4, and BLK6.

Pass transistor PT1 comprises an active region ACT1 and gate lines 120*c* and 120*d* formed thereon, and a driving signal line 121*b* having a driving signal GS<1> provided. Pass transistor PT1 is formed with two sources and one common drain in active region ACT1 due to two gate lines 120*c* and 120*d*. The common drain of pass transistor PT1 is connected through a driving signal line 121*b*, a via V11, a metal line M1, and a metal contact MC1. Source S of pass transistor PT1 is connected to a common driving line 123*b* through a metal contact MC5, a metal line 122*b*, and a via V31. Accordingly, common driving line 123*b* distributes driving signal GS<1> to ground selection lines GSL<1> of each of memory blocks BLK0, BLK2, BLK4, and BLK6.

Driving signal GS<1> provided to common driving line 123*b* is transferred to ground selection line GSL<1> of memory block BLK0 through a metal line 124*b* connected by a via 21. Driving signal GS<1> provided to common driving line 123*b* is transferred to a metal line 125*b* connected through a via V31. Driving signal GS<1> provided to common driving line 123*b* is transferred to a metal line 125*b* through a via V31. Then, driving signal GS<1> is transferred to ground selection signal GSL<1> of memory block BLK2 through a metal line 125*b*. Driving signal GS<1> provided to common driving line 123*b* is transferred to a metal line 126*b* connected through a via V41. Also, driving signal GS<1> is transferred to ground selection line GSL<1> of memory block BLK4 through metal line 126*b*. Driving signal GS<1> provided to common driving line 123*b* is transferred to a metal line 127*b* connected through a via V51. Also, driving signal GS<1> is transferred to ground selection line GSL<1> of memory block BLK6 through metal line 127*b*. Each of metal lines 124*b*, 125*b*, 126*b*, and 127*b* may be electrically connected through each of ground selection lines GSL<1> and metal contacts of memory blocks BLK0, BLK2, BLK4, and BLK6.

Pass transistor PT2 comprises an active region ACT2 and gate lines 120*e* and 120*f* formed thereon, and a driving signal line 121*c* having a driving signal GS<2> is connected to pass transistor PT2. Pass transistor PT2 comprises two sources and one common drain in active region ACT2 due to two gate lines 120*e* and 120*f*. The common drain of pass transistor PT2 is connected through a driving signal line 121*c*, a via V12, a metal line M2, and a metal contact MC2. Source S of pass transistor PT2 is connected to a common driving line 123*c* through a metal contact MC6, a metal line 122*c*, and a via V42. Accordingly, common driving line 123*c* distributes driving signal GS<2> to ground selection lines GSL<2> of each of memory blocks BLK0, BLK2, BLK4, and BLK6.

Driving signal GS<2> provided to common driving line 123*c* is transferred to ground selection line GSL<2> of memory block BLK0 through a metal line 124*c* connected by a via 22. Driving signal GS<2> provided to common driving line 123*c* is transferred to a metal line 125*c* connected through a via V32. Also, driving signal GS<2> is transferred to ground selection signal GSL<2> of memory block BLK2 through a metal line 125*c*. Driving signal GS<2> provided to common driving line 123*c* is transferred to a metal line 126*c* connected through a via V42. Also, driving signal GS<2> is transferred to ground selection line GSL<2> of memory block BLK4 through metal line 126*c*. Driving signal GS<2> provided to common driving line 123*c* is transferred to a metal line 127*c* connected through a via V52. Also, driving signal GS<2> is transferred to ground selection line GSL<2> of memory block BLK6 through metal line 127*c*. Each of metal lines 124*c*, 125*c*, 126*c*, and 127*c* is electrically connected through ground selection line GSL<2> and metal contacts of memory blocks BLK0, BLK2, BLK4, and BLK6.

Pass transistor PT3 comprises an active region ACT5 and gate lines 120*g* and 120*h* formed thereon, and a driving signal line 121*d* having a driving signal GS<3> is connected to pass transistor PT3. Pass transistor PT3 is formed with two sources and one common drain in active region ACT5 due to two gate lines 120*g* and 120*h*. The common drain of pass transistor PT3 is connected through a driving signal line 121*d*, a via V13, a metal line M3, and a metal contact MC3. Source S of pass transistor PT3 is connected to a common driving line 123*d* through a metal contact MC7, a metal line 122*d*, and a via V53. Accordingly, common driving line 123*d* distributes the driving signal GS<3> to ground selection lines GSL<3> of each of memory blocks BLK0, BLK2, BLK4, and BLK6.

Driving signal GS<3> provided to common driving line 123*d* is transferred to ground selection line GSL<3> of memory block BLK0 through a metal line 124*d* connected by a via V23. Driving signal GS<3> provided to common driving line 123*d* is transferred to a metal line 125*d* connected through a via V33. Also, driving signal GS<3> is transferred to ground selection signal GSL<3> of memory block BLK2 through a metal line 125*d*. Driving signal GS<3> provided to common driving line 123*d* is transferred to a metal line 126*d* connected through a via V43. Also, driving signal GS<3> is transferred to ground selection line GSL<3> of memory block BLK4 through metal line 126*d*. Driving signal GS<3> provided to common driving line 123*d* is transferred to a metal line 127*d* connected through a via V53. Also, driving signal GS<3> is transferred to ground selection line GSL<3> of memory block BLK6 through metal line 127*d*. Each of metal lines 124*d*, 125*d*, 126*d*, and 127*d* is electrically connected through each of ground selection lines GSL<3> and metal contacts of memory blocks BLK0, BLK2, BLK4, and BLK6.

In the above description, structures of pass transistors PT0, PT1, PT2, and PT3 are described for transferring the driving signals GS<0>, GS<1>, GS<2>, and GS<3> to the split ground selection lines of each memory blocks BLK0, BLK2, BLK4, and BLK6. However, it will be well understood that ground selection lines GS<0> to GS<3> of each memory blocks BLK1, BLK3, and BLK5 may be equally driven. In addition, the illustrated configurations of the metal contacts are merely examples, and positions of the metal contacts may be changed by various connection schemes.

Figure 9:
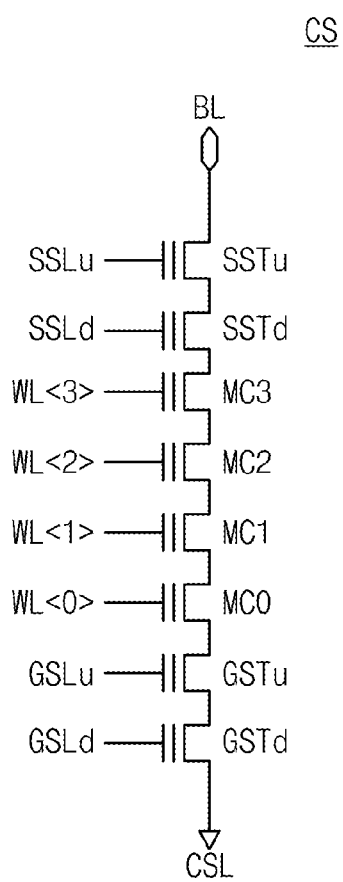
FIG. 9 is a circuit diagram illustrating a cell string according to an embodiment of the inventive concept.

FIG. 9 is a circuit diagram illustrating a cell string according to an embodiment of the inventive concept.

Referring to FIG. 9, the cell string comprises one or more string selection transistors SSTu and SSTd connected to a bit line BL, multiple memory cells MC0 to MC3 formed in a channel of the cell string and serially connected to each other, and one or more ground selection transistors GSTu and GSTd connected between the channel of the cell string and a common source line CSL. Although not shown in the drawing, cell string CS typically comprises a dummy cell DC0 between memory cell MC0 and ground selection transistor GSTu, and a dummy cell DC1 between memory cell MC3 and string selection transistor SSTd.

The one or more string selection transistors SSTu and SSTd comprise gates connected to string selection lines SSLu and SSLd. Memory cells MC0 to MC3 comprise gates connected to word lines WL<0> to WL<3>, and the one or more ground selection transistors GSTu and GSTd comprise gates connected to ground selection lines GSLu and GSLd. Typically, ground selection lines GSLu and GSLd corresponding to the gates of ground selection transistors GSTu and GSTd are driven by identical ground selection signal GS<i>, where i is an integer of 0 or greater.

However, it may need to control each gate voltage level of the ground selection transistors GSTu and GSTd in different values. In this case, voltage levels of ground selection lines GSLu and GSLd corresponding to the gates of ground selection lines GSLu and GSLd may be differently provided. For example, multiple split ground selection lines are provided in one memory block. An upper ground selection line GSLu and a lower ground selection line GSLd of each of selected ground selection lines from among the split ground selection lines may have driving signals GSu and GSd of different levels.

Figure 10:
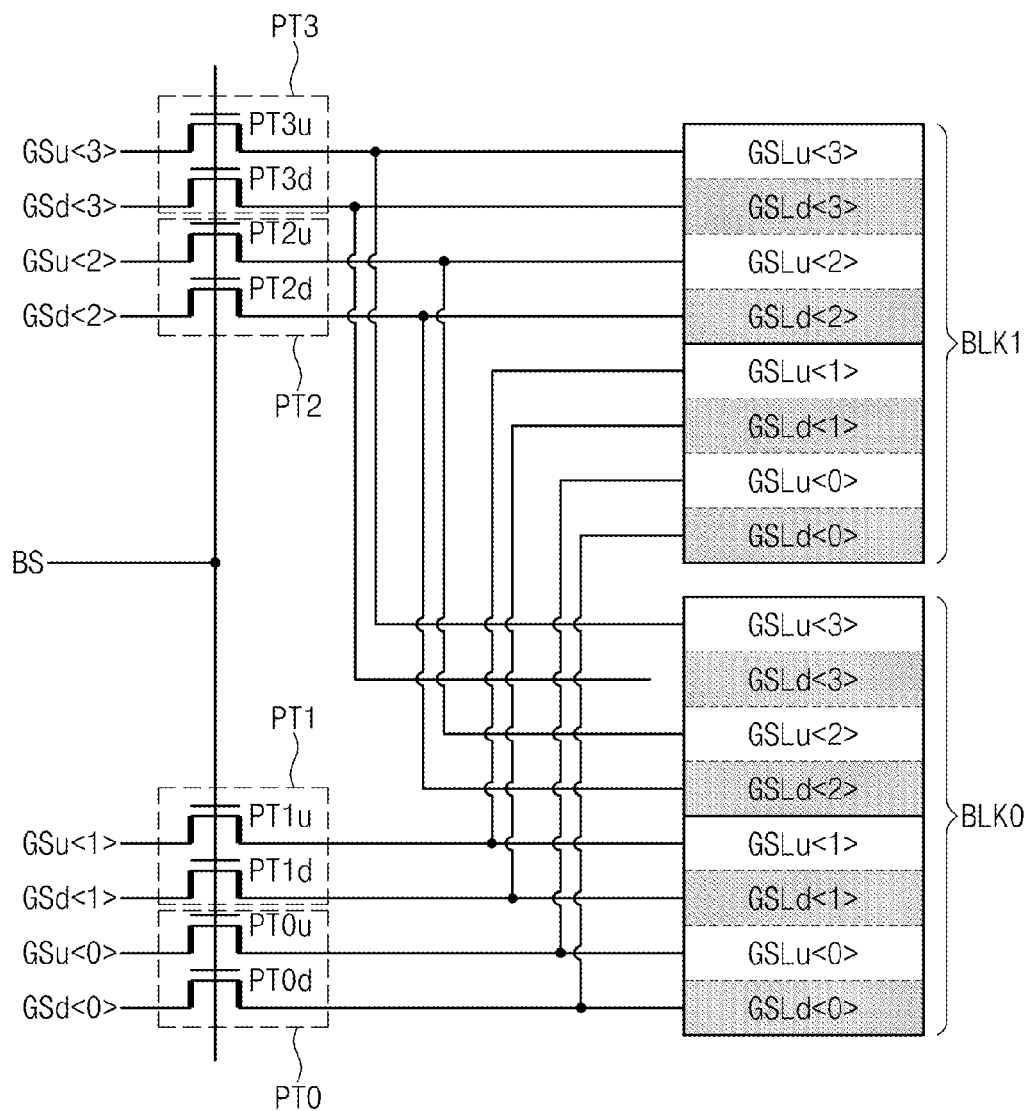
FIG. 10 is a circuit diagram illustrating pass transistors for driving split GSLs corresponding to the cell string structure of FIG. 9, according to an embodiment of the inventive concept.

FIG. 10 is a circuit diagram illustrating pass transistors for driving split ground selection lines corresponding to cell string structure of FIG. 9, according to an embodiment of the inventive concept.

Referring to FIG. 10, pass transistors may drive upper or lower ground selection lines of the memory blocks. For convenience of description, pass transistors for driving ground selection lines of two memory blocks BLK0 and BLK1 are described.

Ground selection signals GSu<0> to GSu<3>, and GSd<0> to GSd<3> generated by voltage generator 160 of FIG. 1 are switched by pass transistors PT0 to PT3 configured with high voltage transistors. Pass transistors PT0 to PT3 may be switched by a block selection signal BS. In addition, each of pass transistors PT1 (0≤i≤3) comprises an upper pass transistor PT1u and a lower pass transistor PT1d.

Pass transistor PT0 drives split ground selection lines GSLu<0> and GSLd<0> of each of memory blocks BLK0 and BLK1. Pass transistor PT0 includes an upper pass transistor PT0u and a lower pass transistor PT0d. Upper pass transistor PT0u transfers a ground selection signal GSu<0> to the upper ground selection line GSL<0> of each memory block BLK0 and BLK1. Lower pass transistor PT0d transfers a ground selection signal GSd<0> to the lower ground selection line GSLd<0> of each memory block BLK0 and BLK1.

Pass transistor PT1 drives split ground selection lines GSLu<1> and GSLd<1> of each memory block BLK0 and BLK1. Pass transistor PT1 comprises an upper pass transistor PT1u and a lower pass transistor PT1d. Upper pass transistor PT1u transfers a ground selection signal GSu<1> to the upper ground selection line GSLu<1> of each memory block BLK0 and BLK1. Lower pass transistor PT1d transfers a ground selection signal GSd<1> to lower ground selection line GSLd<1> of each memory block BLK0 and BLK1.

Pass transistor PT2 drives split ground selection lines GSLu<2> and GSLd<2> of each memory block BLK0 and BLK1. Pass transistor PT2 includes an upper pass transistor PT2u and a lower pass transistor PT2d. Upper pass transistor PT2u transfers a ground selection signal GSu<2> to the upper ground selection line GSLu<2> of each memory block BLK0 and BLK1. Lower pass transistor PT2d transfers a ground selection signal GSd<2> to the lower ground selection line GSLd<2> of each memory block BLK0 and BLK1.

Pass transistor PT3 drives split ground selection lines GSLu<3> and GSLd<3> of each memory block BLK0 and BLK1. Pass transistor PT3 includes an upper pass transistor PT3u and a lower pass transistor PT3d. Upper pass transistor PT3u transfers a ground selection signal GSu<3> to the upper ground selection line GSLu<3> of each memory block BLK0 and BLK1. Lower pass transistor PT3d transfers a ground selection signal GSd<3> to lower ground selection line GSLd<3> of each memory block BLK0 and BLK1.

Pass transistors PT0u, PT0d, PT1u, PT1d, PT2u, PT0d, PT2u, PT2d, PT3u, and PT3d may drive ground selection signals of at least two different memory blocks. Through this structure, the split ground selection lines may be easily controlled without additional pass transistors.

Figure 11:
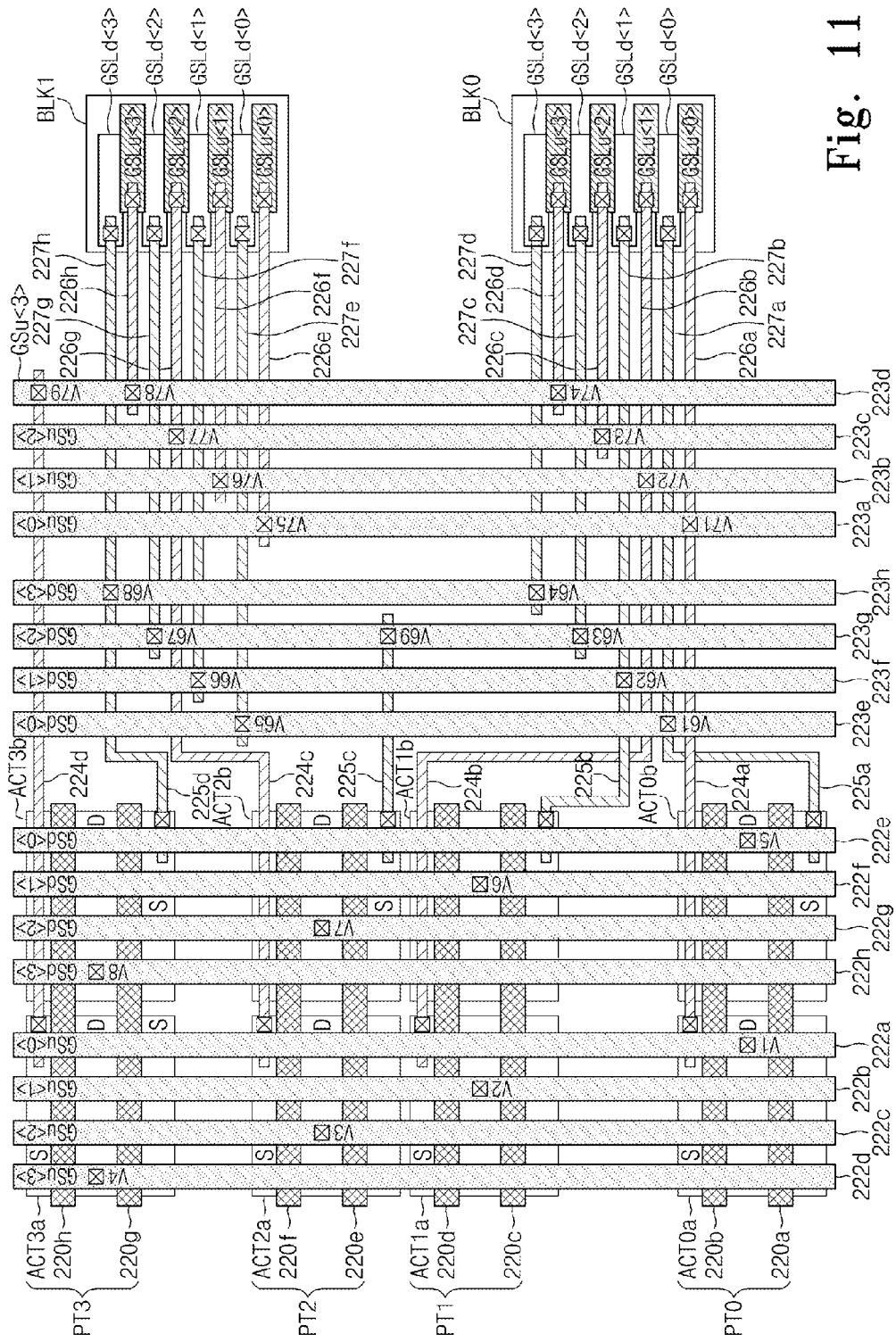
FIG. 11 illustrates a layout structure of the pass transistors and interconnections of FIG. 10, according to an embodiment of the inventive concept.

FIG. 11 illustrates a layout structure of the pass transistors and the interconnections of FIG. 10, according to an embodiment of the inventive concept.

Referring to FIG. 11, a layout structure of a row decoder is shown in which one pass transistor drives ground selection lines of multiple memory blocks.

Pass transistor PT0 comprises a pass transistor PT0u and a pass transistor PT0d. Pass transistor PT0u includes an active region ACT0a and gate lines 220a and 220b formed thereon, and multiple driving signal lines 222a, 222b, 222c, and 222d having driving signals GSu<0>, GSu<1>, GSu<2>, and GSu<3> provided. Pass transistor PT0u is formed to have two sources and one common drain in active region ACT0a due to two gate lines 220a and 220b.

The common drain of pass transistor PT0u, which is formed on active region ACT0a, may be connected to driving signal line 222a through a via V1. As described above in relation to FIG. 8, the common drain of pass transistor PT0u may be connected through a metal line and metal contacts connected to the via V1. Further description of this structure will be omitted to avoid redundancy.

Source S of pass transistor PT0u is connected to common driving line 223a through metal contacts, a metal line 224a, and a via V71. Accordingly, common driving line 223a distributes driving signal GSu<0> to a ground selection line GSLu<0> of each memory block BLK0 and BLK1. Driving signal GSu<0> provided to common driving line 223a is transferred to a ground selection line GSLu<0> of memory block BLK0 through a metal line 226a. Driving signal GSu<0> provided to common driving line 223a is transferred to a metal line 226e connected through a via V75. Also, the driving signal GS<0> is transferred to ground selection line GSLu<0> of memory block BLK1 through metal line 226e.

Pass transistor PT0d comprises an active region ACT0b and gate lines 220a and 220b formed thereon, and multiple driving signal lines 222e, 222f, 222g, and 222h having driving signals GSd<0>, GSd<1>, GSd<2>, and GSd<3> provided. Pass transistor PT0d is formed to have two sources and one common drain in active region ACT0b due to two gate lines 220a and 220b.

Source S of pass transistor PT0d is connected to common driving line 223e through metal contacts, a metal line 225a, and a via V61. Accordingly, common driving line 223e distributes the driving signal GSd<0> to a ground selection line GSLd<0> of each memory block BLK0 and BLK1. Driving signal GSd<0> provided to common driving line 223e is transferred to a ground selection line GSLd<0> of memory block BLK0 through metal lines 227a and 227e. Ground selection lines GSLd<m> and GSLu<m>, where m is a natural number, of each memory block BLK0 or BLK1 may be formed of different conductive layers.

Structures of pass transistors PT1, PT2, and PT3 for driving the upper and lower ground selection lines are similar to those of the above described pass transistor PT1. Accordingly, their detailed description is omitted.

Figure 12:
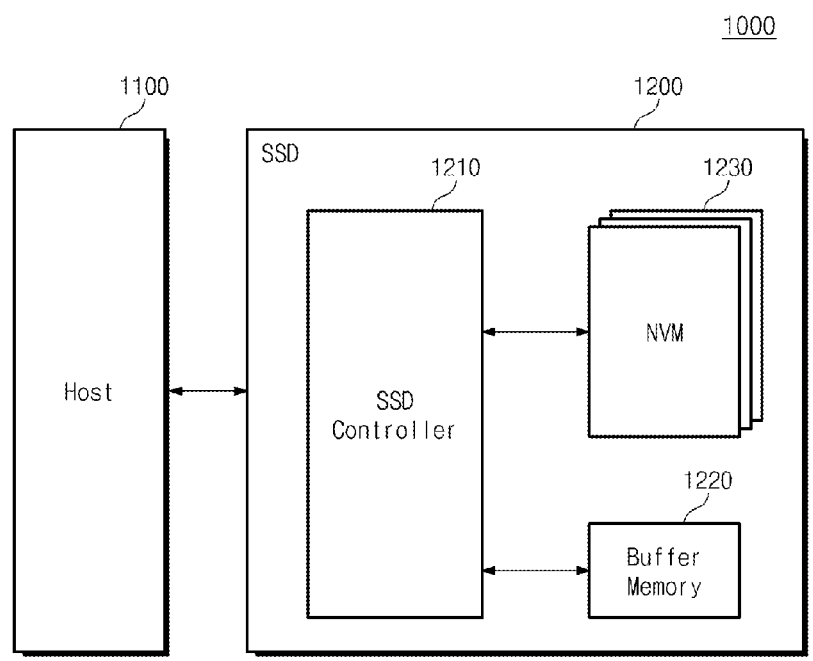
FIG. 12 is a block diagram illustrating a user device according to an embodiment of the inventive concept.

FIG. 12 is a block diagram illustrating a user device 1000 comprising a solid state disk (SSD) according to an embodiment of the inventive concept.

Referring to FIG. 12, user device 1000 comprises a host 1100 and an SSD 1200. SSD 1200 comprises an SSD controller 1210, a buffer memory 1220, and a nonvolatile memory device (NVM) 1230.

The SSD controller provides a physical connection with host 1100 and SSD 1200. Namely, SSD controller 1210 provides interfacing with SSD 1200 in correspondence to a bus format of host 1100. In particular, SSD controller 1210 decodes commands provided from host 1100. According to the decoded result, SSD controller 1210 accesses nonvolatile memory device 1230. The bus format of host 1100 comprises a universal serial bus (USB), a small computer system interface (SCSI), a peripheral component interconnect (PCI) express, advance technology attachment (ATA), parallel ATA (PATA), serial ATA (SATA), and a serial attached SCSI (SAS), etc.

Buffer memory 1220 temporarily stores write data provided from host 1100 or data read from nonvolatile memory device 1230. Buffer memory 1220 may be provided as a synchronous DRAM for providing sufficient buffering in SSD 1200 used as a large capacity auxiliary memory device. However, buffer memory 1220 is not limited hereto.

Nonvolatile memory device 1230 is provided as a storage medium of SSD 1200. For example, nonvolatile memory device 1230 may be provided as a vertical NAND-type flash memory of a large capacity. Nonvolatile memory device 1230 may be configured with multiple memory devices. In this case, each memory device is connected to SSD controller 1210 in a channel unit. As a storage medium, the NAND flash memory is exemplified as nonvolatile memory device 1230, but other nonvolatile memory devices may form nonvolatile memory device 1230. As the storage medium, a PRAM, a MRAM, a ReRAM, an FRAM, and a NOR flash memory may be adopted, or a memory system having heterogeneous memory devices may be also adopted.

In the above-described SSD 1200, nonvolatile memory device 1230 may be a vertical NAND-type flash memory device having cell strings formed vertically to a substrate thereof. Nonvolatile memory device 1230 may be provided in a structure having multiple ground selection lines split in one memory block. Also, nonvolatile memory device 1230 may include a row decoder formed to allow one pass transistor to drive ground selection lines of different blocks.

Figure 13:
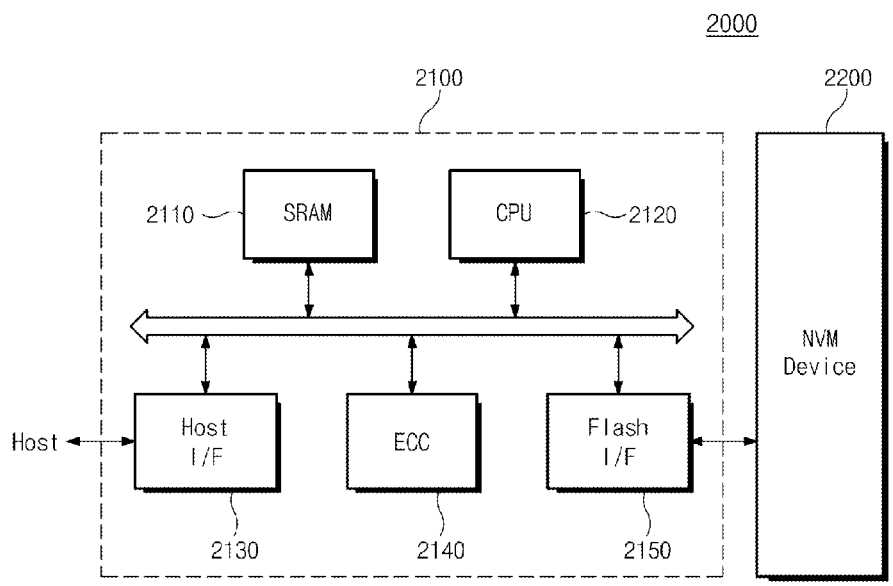
FIG. 13 is a block diagram illustrating a memory system according to an embodiment of the inventive concept.

FIG. 13 is a block diagram illustrating a memory system 2000, according to an embodiment of the inventive concept.

Referring to FIG. 13, memory system 2000 comprises a nonvolatile memory device 2200 and a memory controller 2100.

Memory controller 2100 is configured to control nonvolatile memory device 2200. A memory card may be formed by combining nonvolatile memory device 2200 and memory controller 2100. An SRAM 2110 is used as an operation memory of a processing unit 2120. A host interface (I/F) 2130 comprises a data exchange protocol of a host connected to memory system 2000. An error correcting block 2140 detects and corrects errors in data read from nonvolatile memory device 2200. Memory interface 2150 interfaces with nonvolatile memory device 2200. A processing unit 2120 performs entire control operations for data exchange of memory controller 2100. Although not shown in the drawing, it is obvious to those skilled in the art that memory system 2000 may further comprise a ROM (not shown) storing code data for interfacing with the host.

Nonvolatile memory device 2200 may be provided as a multi-chip package formed of multiple flash memory chips. Nonvolatile memory device 2200 may comprise a row decoder structure according to an embodiment of the inventive concept. Namely, nonvolatile memory device 2200 may be a vertical NAND-type flash memory device having cell strings formed vertically to a substrate thereof. Nonvolatile memory device 2200 may be provided in a structure having multiple ground selection lines split in one memory block. Also, nonvolatile memory device 2220 may include a row decoder formed to allow one pass transistor to drive ground selection lines of different blocks.

The above-described memory system 2000 may be provided as a storage medium having relatively high reliability and relatively low error probability. In this case, memory controller 2100 is configured to communicate with the outside (e.g., a host) through one of various interface protocols such as a USB, a multimedia card (MMC), PCI-express (PCI-E), a SAS, SATA, PATA, a SCSI, an enhanced small disk interface (ESDI), and an integrated drive electronics (IDE).

Figure 14:
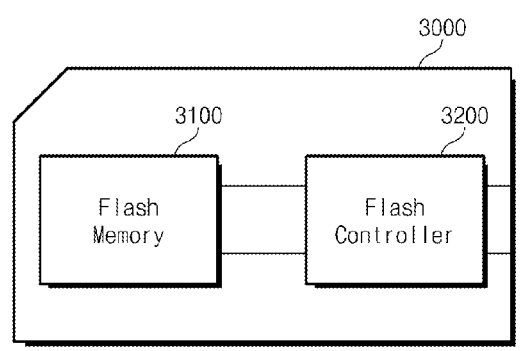
FIG. 14 is a block diagram illustrating a data storing device according to an embodiment of the inventive concept.

FIG. 14 is a block diagram illustrating a data storing device 3000 according another embodiment of the inventive concept.

Referring to FIG. 14, data storing device 3000 comprises a flash memory 3100 and a flash controller 3200. Flash controller 3200 controls flash memory 3100 on the basis of control signals received from the outside of data storing device 3000.

Also, a configuration of flash memory 3100 may be substantially the same as that of the nonvolatile memory device shown in FIG. 1. Flash memory 3100 may include a row decoder structure according to an embodiment of the inventive concept. Flash memory 3100 may be a vertical NAND-type flash memory device having cell strings formed vertically to a substrate thereof. Flash memory 3100 may be provided in a structure having multiple ground selection lines split in one memory block. Flash memory 3100 may include a row decoder formed to allow one pass transistor to drive ground selection lines of different blocks. Flash memory 3100 of the inventive concept may be formed in any one of a stacked flash structure having arrays stacked in multiple layers, a flash structure without source-drain, a pin-type flash structure, and a 3D flash structure.

Data storing device 3000 may form a memory card device, an SSD device, a multimedia card device, a secure digital (SD) card device, a memory stick device, a hard disk drive device, a hybrid drive device, or a USB flash device, for instance Data storing device 3000 may form a card satisfying an industry standard for using a user's device such as a digital camera, or a personal computer.

Figure 15:
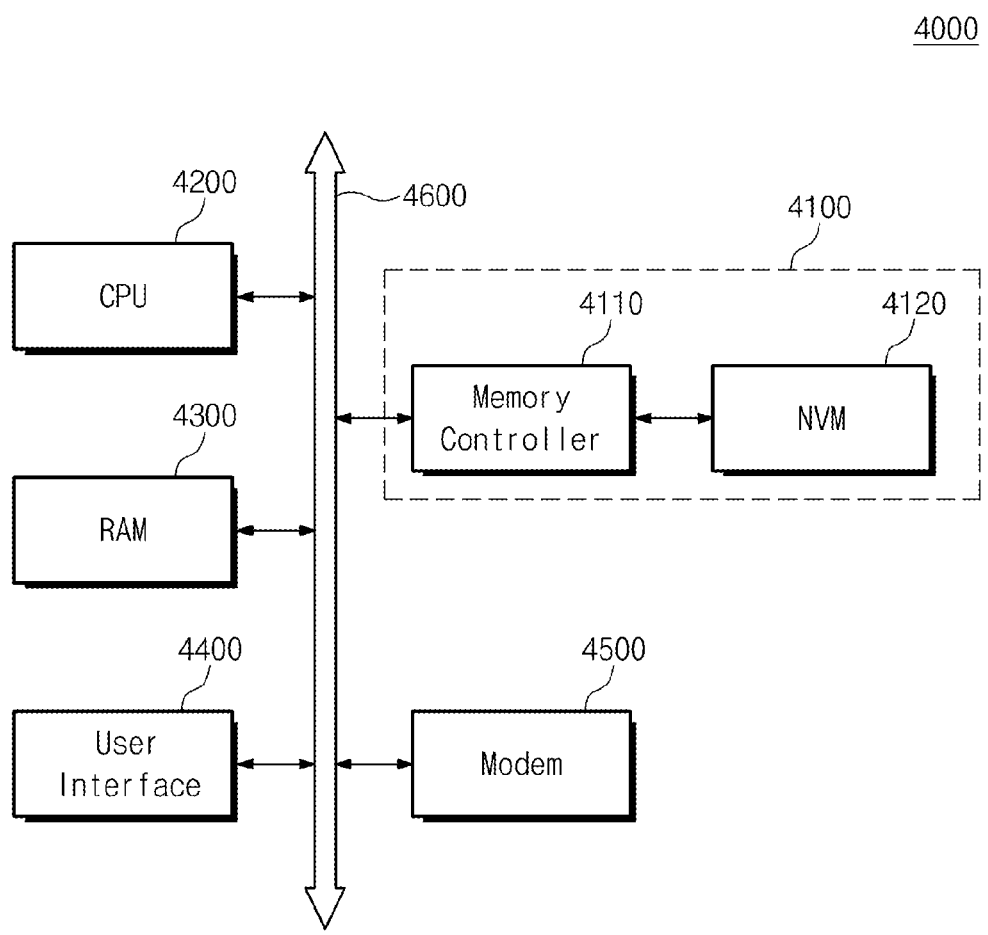
FIG. 15 is a block diagram illustrating a computing system according to an embodiment of the inventive concept.

FIG. 15 illustrates a computing system 4000 comprising a nonvolatile memory device.

Referring to FIG. 15, computing system 4000 comprises a microprocessor 4200 electrically connected to a system bus 4600, a RAM 4300, a user interface 4400, a modem 4500 such as a baseband chipset, and a memory system 4100.

Where computing system 4000 is a mobile device, a battery (not shown) is additionally provided for providing an operation voltage of computing system 4000. Although not shown in the drawing, computing system 4000 may further comprise an application chipset, a camera image processor (CIS), or a mobile DRAM. Memory system 4100 may form, for example, an SSD using a nonvolatile memory for storing data. Alternatively, memory system 4100 may be provided as a fusion flash memory (e.g., OneNAND flash memory).

Memory system 4100 comprises a memory controller 4110 and a nonvolatile memory device 4120. Nonvolatile memory device 4120 may include a row decoder structure according to an embodiment of the inventive concept.

A nonvolatile memory device and/or memory controller may be embedded by using various type packages. For example, the flash memory device and/or memory controller may be embedded by using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP).

According to the present disclosure, a chip area occupied by a row decoder can be reduced in a vertical NAND flash memory device having a split GSL structure.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A nonvolatile memory device, comprising:
    a plurality of vertical NAND flash memory cells arranged in a three dimensional (3D) structure;
    a first memory block disposed in the 3D structure and having memory cells selected by a first ground selection line and a second ground selection line, wherein the first and second ground selection lines are electrically separated from each other;
    a second memory block disposed in the 3D structure and having memory cells selected by a third ground selection line and fourth ground selection line, wherein the third and fourth ground selection lines are electrically separated from each other; and
    a first pass transistor that transfers a driving signal to turn on ground selection transistors respectively connected to the first ground selection line of the first memory block and the third ground selection line of the second memory block in response to a block selection signal.

2. The nonvolatile memory device of claim 1, further comprising a second pass transistor that concurrently transfers a driving signal to turn off ground selection transistors respectively connected to the second ground selection line of the first memory block and the fourth ground selection line of the second memory block in response to the block selection signal.

3. The nonvolatile memory device of claim 2, wherein string selection transistors for each of multiple cell strings connected to the second and fourth ground selection lines are turned off.

4. The nonvolatile memory device of claim 2, wherein a channel of each of multiple cell strings connected to the second and fourth ground selection lines is set in a floating state.

5. The nonvolatile memory device of claim 1, wherein string selection transistors for each of multiple cell strings connected to the third ground selection line are turned off.

6. The nonvolatile memory device of claim 1, wherein a level of the driving signal transferred to the first and third ground selection lines is a non-selection read voltage.

7. The nonvolatile memory device of claim 1, further comprising:
    a first metal line connected to a source of the pass transistor through a metal contact;
    a common driving line connected to the first metal line;
    a second metal line formed between the common driving line and the first ground selection line and transferring the driving signal through a via or metal contacts; and
    a third metal line formed between the common driving line and the third ground selection line and transferring the driving signal through a via or metal contacts.

8. The nonvolatile memory device of claim 7, wherein the common driving line and the first metal line are electrically connected through a via.

9. The nonvolatile memory device of claim 7, wherein the second and third metal lines are formed on an identical semiconductor layer.

10. A nonvolatile memory device, comprising:
    a plurality of vertical NAND flash memory cells arranged in a three dimensional (3D) structure;
    multiple memory blocks disposed in the 3D structure and each comprising multiple individually electrically separated ground selection lines; and
    a row decoder concurrently transferring ground selection signals for turning on ground selection transistors connected to the ground selection lines of at least two memory blocks from among the memory blocks in response to block selection signals,
    wherein the row decoder transfers the ground selection signals to the ground selection lines of the at least two memory blocks by one pass transistor.

11. The nonvolatile memory device of claim 10, wherein the row decoder comprises:
    a first pass transistor that turns on each lower ground selection transistor of a first cell string of a first memory block and a second cell string of a second memory block; and
    a second pass transistor that turns on each upper selection transistor of the first cell string of the first memory block and the second cell string of the second memory block.

12. The nonvolatile memory device of claim 11, wherein a voltage level of a first ground selection signal transferred by the first pass transistor is different from that of a second ground selection signal transferred by the second pass transistor.

13. The nonvolatile memory device of claim 12, wherein the row decoder comprises:
    a first metal line connected to a source of the first pass transistor through a metal contact;
    a first common driving line connected to the first metal line;
    a second metal line disposed between the first common driving line and lower ground selection lines of the first cell string, and transferring the first ground selection signal through a via or metal contacts; and a third metal line disposed between the first common driving line and lower ground selection lines of the second cell string, and transferring the first ground selection signal through a via or metal contacts.

14. The nonvolatile memory device of claim 12, wherein the row decoder comprises:
a fourth metal line connected to a source of the second pass transistor through a metal contact;
a second common driving line connected to the fourth metal line;
a fifth metal line disposed between the second common driving line and upper ground selection lines of the first cell string, and transferring the second ground selection signal through a via or metal contacts; and
a sixth metal line disposed between the second common driving line and the upper ground selection lines of the first cell string, and transferring the second ground selection signal through a via or metal contacts.

15. A method of operating a nonvolatile memory device comprising a plurality of vertical NAND flash memory cells arranged in a three dimensional (3D) structure, a first memory block disposed in the 3D structure and having memory cells selected by a first ground selection line and a second ground selection line, wherein the first and second ground selection lines are electrically separated from each other, and a second memory block disposed in the 3D structure and having memory cells selected by a third ground selection line and fourth ground selection line, wherein the third and fourth ground selection lines are electrically separated from each other, the method comprising:
transferring a driving signal via a first pass transistor to turn on ground selection transistors respectively connected to the first ground selection line of the first memory block and the third ground selection line of the second memory block in response to a block selection signal.

16. The method of claim 15, further comprising concurrently transferring, via a second pass transistor, a driving signal to turn off ground selection transistors respectively connected to the second ground selection line of the first memory block and the fourth ground selection line of the second memory block in response to the block selection signal.

17. The method of claim 16, further comprising, during the concurrent transferring, turning off string selection transistors for each of multiple cell strings connected to the second and fourth ground selection lines.

18. The method of claim 16, further comprising, during the concurrent transferring, setting in a floating state a channel of each of multiple cell strings connected to the second and fourth ground selection lines.

19. The method of claim 15, further comprising, during the transferring, turning off string selection transistors for each of multiple cell strings connected to the third ground selection line.

* * * * *